United States Patent [19]
Eckert

[11] Patent Number: 5,060,243
[45] Date of Patent: Oct. 22, 1991

[54] RIPPLE COUNTER WITH REVERSE-PROPAGATED ZERO DETECTION

[75] Inventor: Kim H. Eckert, Austin, Tex.

[73] Assignee: Motorola, Inc., Schaumburg, Ill.

[21] Appl. No.: 530,703

[22] Filed: May 29, 1990

[51] Int. Cl.[5] .................... H03K 21/40; H03K 21/10
[52] U.S. Cl. ........................................ 377/28; 377/55;
377/56; 377/111; 377/114; 377/116
[58] Field of Search ............... 377/56, 55, 114, 28,
377/81, 75, 107, 110, 116, 115, 111

[56] References Cited

U.S. PATENT DOCUMENTS

| | | | |
|---|---|---|---|
| 3,051,855 | 8/1962 | Lee | 377/28 |
| 3,725,791 | 4/1973 | Moreau et al. | 377/73 |
| 4,002,926 | 1/1977 | Moyer | 377/107 |
| 4,493,095 | 1/1985 | Yazawa | 377/114 |
| 4,512,030 | 4/1985 | Fukuta | 377/107 |
| 4,726,045 | 2/1988 | Caspell et al. | 377/110 |
| 4,891,827 | 1/1990 | Slater | 377/107 |

Primary Examiner—John S. Heyman
Attorney, Agent, or Firm—Robert L. King

[57] ABSTRACT

An asynchronous ripple counter counts from a predetermined binary value to zero in response to an input clock signal. Zero detection logic is coupled to the ripple counter for detecting, from a most significant bit to a least significant bit of the ripple counter, when the counter has counted to zero. Both the counter and the zero detection logic receive and store the predetermined binary value. The monitoring of the ripple counter's digits from MSB to LSB prevents false detections of zero states in the ripple counter and allows the ripple counter to be extended to an arbitrarily large number of bits without sacrificing the maximum input clock frequency.

8 Claims, 4 Drawing Sheets

FIG. 1 —PRIOR ART—

| COUNTER VALUE | SYNCHRONOUS COUNTER STATES | ASYNCHRONOUS COUNTER STATES |
|---|---|---|
| 9 | 1001 | 1001 |
| 8 | 1000 | 1000 |
| 7 | 0111 | 1001*<br>1011*<br>1111*<br>0111 |
| 6 | 0110 | 0110 |
| 5 | 0101 | 0111*<br>0101 |
| 4 | 0100 | 0100 |
| 3 | 0011 | 0101*<br>0111*<br>0011 |
| 2 | 0010 | 0010 |
| 1 | 0001 | 0011*<br>0001 |
| 0 | 0000 | 0000 |

*FIG.3*

| ASYNCHRONOUS COUNTER STATES | HEXADECIMAL VALUE |
|---|---|
| 00010001 | 11 |
| 00010000 | 10 |
| 00010001 | 0f |
| 00010010 | 0e |
| 00010111 | 0d |
| 00011100 | 0c |
| 00001101 | 0b |
| 00001110 | 0a |
| 00001011 | 09 |
| 00001000 | 08 |
| 00001001 | 07 |
| 00001010 | 06 |
| 00001111 | 05 |
| 00000100 | 04 |
| 00000101 | 03 |
| 00000110 | 02 |
| 00000011 | 01 |
| 00000000 | 00 |

RIPPLE COUNTER WITH REVERSE-PROPAGATED ZERO DETECTION

TECHNICAL FIELD

This invention relates to electronic circuits, and more particularly, to electronic counter circuits.

BACKGROUND OF THE INVENTION

When known counter circuits are implemented to count numbers having a large number of digits, a tradeoff between circuit area and speed of operation is encountered. A common technique used to implement an electronic count function is to use a prescaler circuit and multiple stages of binary counters which propagate a carry chain. A disadvantage with a separate carry chain in a counter is that for every clock cycle, the carry bit must be propagated from the LSB to the MSB before the counter stages can be toggled again. The stated disadvantage exists for both loading the counter with an initial count value as well as in incrementing or decrementing. To solve the speed problem, a parallel architecture may be implemented which increases both the amount of circuitry and layout routing. Accordingly, a choice between size and speed is required when using counters with numbers having large bit widths.

SUMMARY OF THE INVENTION

In practising the invention, there is provided, in one form, a circuit for counting from a first predetermined binary number to a second predetermined binary number. Counter means of predetermined bit length receive the first predetermined binary number, store the first binary number and serially count to the second binary number by transitioning between a plurality of intermediate count numbers. The counting is implemented by sequentially toggling bit values from a least significant bit position to a most significant bit position of the counter means. Detection means are coupled to the counter means for providing an output indicating when the counter means has counted to the second binary number. The detection means also receives the first predetermined binary number and monitors the serial counting of the counter means by detecting, from a most significant bit position to a least significant bit position, when bits of the intermediate count numbers assume a predetermined logic value. The detection means do not allow the output to be falsely provided as the result of transitional bit changes in the counter means.

These and other features and advantages will be more clearly understood from the following detailed description taken in conjunction with the accompanying drawings.

BRIEF DESCRIPTION OF THE DRAWINGS

FIG. 3 illustrates in table form a comparison of count values between a synchronous counter and an asynchronous counter; and FIG. 4 illustrates in table form a comparison between asynchronous counter states and hexadecimal values.

DESCRIPTION OF A PREFERRED EMBODIMENT

Figure 1:
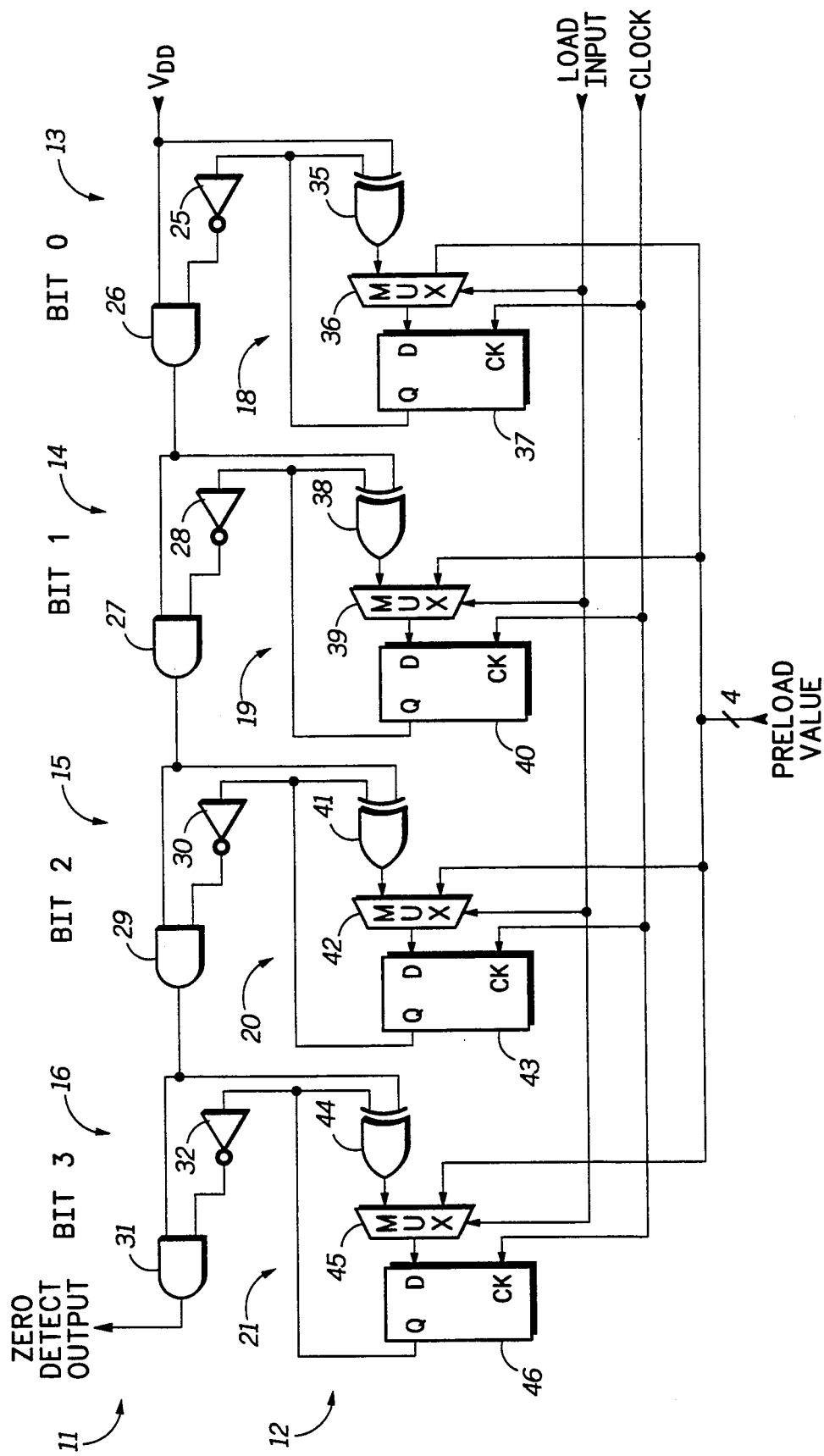
FIG. 1 illustrates in logic diagram form a known counter circuit.

Shown in FIG. 1 is a known synchronous down counter 10 generally having a borrow portion 11 and a count portion 12. Within borrow portion 11 are borrow cells 13, 14, 15 and 16 which are ranked from a least significant bit (Bit 0) to a most significant bit (Bit 3). Within count portion 12 are counter cells 18, 19, 20 and 21.

Borrow cell 13 comprises an inverter 25 having an input and an output connected to a first input of an AND gate 26. A second input of AND gate 26 is connected to a logic high input in the form of a positive power supply voltage, $V_{DD}$. An output of AND gate 26 is connected to a first input of an AND gate 27 of borrow cell 14. An inverter 28 has an input, and an output connected to a second input of AND gate 27. An output of AND gate 27 is connected to a first input of an AND gate 29 of borrow cell 15. An inverter 30 has an input, and an output connected to a second input of AND gate 29. An output of AND gate 29 is connected to a first input of an AND gate 31 of borrow cell 16. An inverter 32 has an input, and an output connected to a second input of AND gate 31. An output of AND gate 31 provides a signal labeled "Zero Detect Output" which indicates when counter 10 has counted from a predetermined value down to zero.

Counter cell 18 has an exclusive OR gate 35 having a first input connected to the input of inverter 25, a second input connected to the supply voltage $V_{DD}$, and an output connected to a first input of a multiplexor (MUX) 36. A second input of multiplexor 36 is connected to a first predetermined bit of a Preload Value signal. A control input of multiplexor 36 is connected to a Load Input signal. An output of multiplexor 36 is connected to a D data input of a flip-flop 37. A Q data output of flip-flop 37 is connected to the input of inverter 25 and the first input of exclusive OR gate 35. A clock (CK) input of flip-flop 37 is connected to a Clock signal.

Counter cell 19 has an exclusive OR gate 38 having a first input connected to the input of inverter 28, a second input connected to the output of AND gate 26, and an output connected to a first input of a multiplexor (MUX) 39. A second input of multiplexor 39 is connected to a second predetermined bit of the Preload Value signal. A control input of multiplexor 39 is connected to a Load Input signal. An output of multiplexor 39 is connected to a D data input of a flip-flop 40. A Q data output of flip-flop 40 is connected to the input of inverter 28 and the first input of exclusive OR gate 38. A clock input of flip-flop 40 is connected to the Clock signal.

Counter cell 20 has an exclusive OR gate 41 having a first input connected to the input of inverter 30, a second input connected to the output of AND gate 27, and an output connected to a first input of a multiplexor (MUX) 42. A second input of multiplexor 42 is connected to a third predetermined bit of the Preload Value signal. A control input of multiplexor 42 is connected to a Load Input signal. An output of multiplexor 42 is connected to a D data input of a flip-flop 43. A Q data output of flip-flop 43 is connected to the input of inverter 30 and to the first input of exclusive OR gate 41. A clock input of flip-flop 43 is connected to the Clock signal.

Counter cell 21 has an exclusive OR gate 44 having a first input connected to the input of inverter 32, a second input connected to the output of AND gate 29, and an output connected to a first input of a multiplexor (MUX) 45. A second input of multiplexor 45 is connected to a fourth predetermined bit of the Preload Value signal. A control input of multiplexor 45 is connected to a Load Input signal. An output of multiplexor 45 is connected to a D data input of a flip-flop 46. A Q data output of flip-flop 46 is connected to the input of inverter 32 and to the first input of exclusive OR gate 44. A clock input of flip-flop 46 is connected to the Clock signal.

In operation, an initial four-bit binary number is provided in parallel to synchronous down counter 10 as the preload value. When the load input control signal is asserted at the control inputs of multiplexors 36, 39, 42 and 45, the preload value is coupled to flip-flops 37, 40, 43 and 46 and stored by the flip-flops. At this point, down counter 10 has the first binary number from which to count down to zero in integer steps. For each clock cycle, down counter 10 subtracts one from the count value and when zero is reached, the output of AND gate 31 is asserted. Therefore, the counting occurs in a synchronous manner controlled by the clock signal which is connected to flip-flops 37, 40, 43 and 46. In the count mode, the load input control signal forces multiplexors 36, 39, 42 and 45 to couple the respective outputs of exclusive OR gates 35, 38, 41 and 44 to flip-flops 37, 40, 43 and 46, respectively. The least significant bit (LSB), bit zero, receives a logic one ($V_{DD}$) borrow input and generates the equivalent output to the next bit, bit one. Should synchronous counter 10 also be used to count up, the logic one input at bit zero is a carry input. The output of each bit of each of borrow cells 13–16 is a function of the borrow input and the state of the current counter bit for that cell in count portion 12. Count portion 12 functions as a conventional binary counter and counts at the clock rate. Borrow portion 11 functions, for each bit, to determine whether or not that bit should toggle. Down counter 10 may be considered as a borrow chain for each bit and a static flip-flop for each bit that toggles conditionally depending upon the other bits in the serial chain. If a borrow input to a certain bit occurs, then the flip-flop of that bit toggles as a result of the output of the exclusive OR changing. It should be noted that the LSB, bit zero, in the binary count sequence is continuously toggling every clock cycle. Depending upon the state of the LSB, the next most significant bit, bit one, toggles only every other clock cycle. The borrow chain of each of borrow cells 13–15 controls the toggling of each of the more significant bits. Therefore, a borrow output at the output of AND gate 31 occurs once every $2^4$ or sixteen clock cycles. Therefore, counter circuit 10 can be used by logic external to counter 10 to detect a unique condition, such as the counting from binary three to zero. The counting function of counter 10 is split between the count and borrow portions 11 and 12. First, a borrow or carry chain is implemented to determine what should happen on the next clock cycle. Each counter cell simply toggles or not depending upon the logic value of the input to each cell.

The use of a separate carry chain and a counter bit interconnected to the carry chain is common within known counter circuits. In every clock cycle, the carry bit value must be propagated from the least significant bit to the most significant bit before the counter is toggled again. The delay associated with the propagation exists regardless of whether the counter is counting or being loaded with an initial value. There have been many solutions proposed to minimize the propagation delays but each requires additional circuitry.

Figure 2:
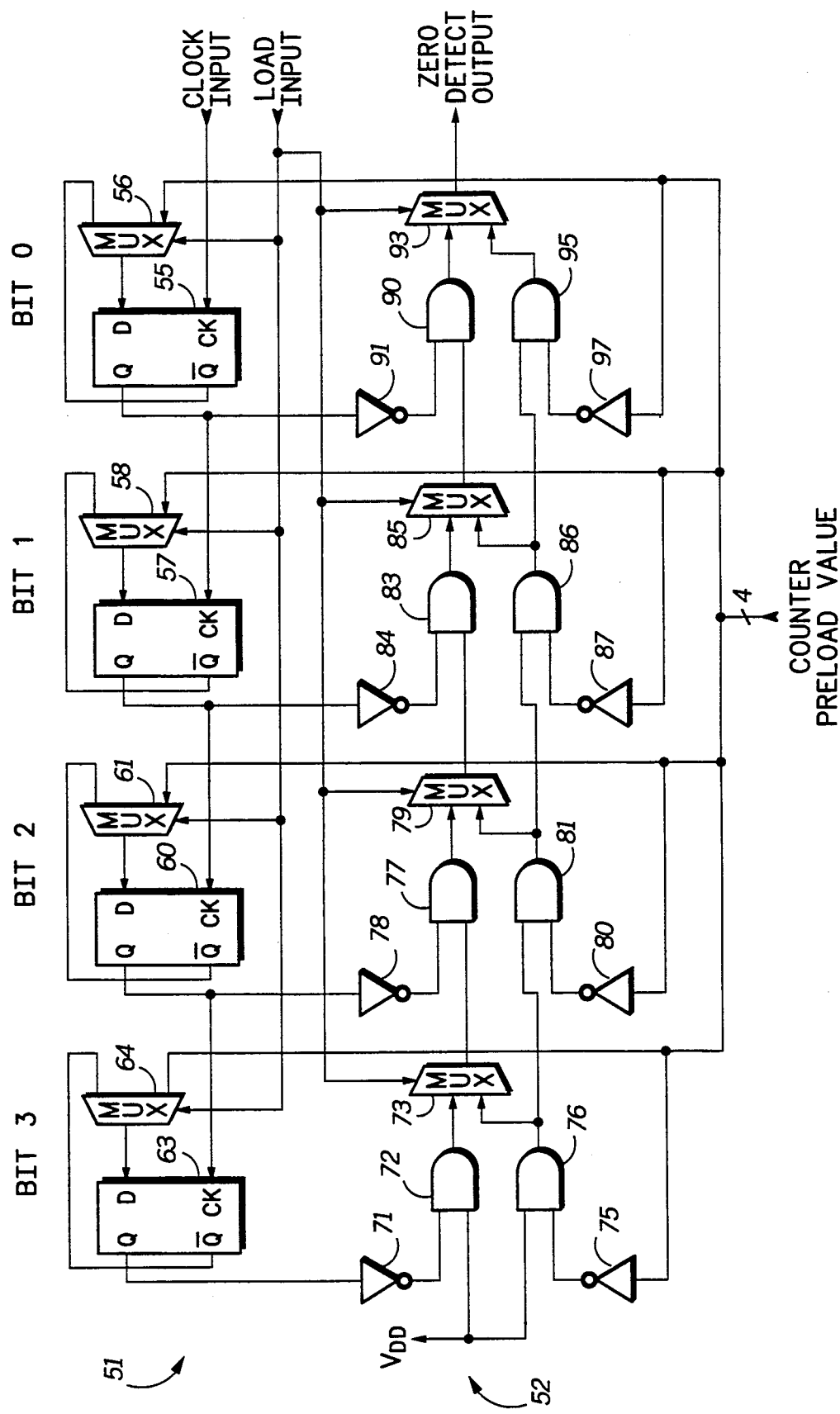
FIG. 2 illustrates in logic diagram form a counter with zero detection in accordance with the present invention.

Shown in FIG. 2 is a block diagram of a counter 50 with zero detection in accordance with the present invention. Counter 50 generally comprises a ripple counter portion 51 and a zero detection portion 52. Within counter portion 51, a multiplexor 56 has a first input for receiving a first predetermined bit of a four-bit Counter Preload Value, a second input, and an output connected to a D data input of a flip-flop 55. Flip-flop 55 has a clock input for receiving a Clock signal, a Q data output and a complementary data output connected to the second input of multiplexor 56. A flip-flop 57 has a clock input connected to the Q data output flip-flop 55. A multiplexor 58 has a first input connected to a second predetermined bit of the Counter Preload Value, a second input, and an output connected to a D data input of flip-flop 57. A complementary data output of flip-flop 57 is connected to the second input of multiplexor 58, and a Q data output connected to a clock input of a flip-flop 60. A multiplexor 61 has a first input connected to a third predetermined bit of the Counter Preload Value, a second input, and an output connected to a D data input of flip-flop 60. A complementary data output of flip-flop 60 is connected to a second input of multiplexor 61, and a Q data output of flip-flop 60 is connected to a clock input of a flip-flop 63. A multiplexor 64 has a first input connected to a fourth predetermined bit of the Counter Preload Value. Multiplexor 64 has an output connected to a D data input of flip-flop 63. A complementary data output of flip-flop 63 is connected to a second input of multiplexor 64. A control input of each of multiplexors 56, 58, 61 and 64 is connected to a Load Input signal.

In zero detection portion 52, an input of an inverter 71 is connected to a Q data output of flip-flop 63. An output of inverter 71 is connected to a first input of an AND gate 72. A second input of AND gate 72 is connected to supply voltage $V_{DD}$. An output of AND gate 72 is connected to a first input of a multiplexor 73. The fourth predetermined bit of the Counter Preload Value is also connected to an input of an inverter 75. An output of inverter 75 is connected to a first input of an AND gate 76. A second input If AND gate 76 is connected to supply voltage $V_{DD}$. An output of AND gate 76 is connected to a second input of multiplexor 73. An output of multiplexor 73 is connected to a first input of an AND gate 77. The Q data output of flip-flop 60 is also connected to an input of an inverter 78 which has an output connected to a second input of AND gate 77. An output of AND gate 77 is connected to a first input of a multiplexor 79. The third predetermined bit of the Counter Preload Value is connected to an input of an inverter 80. An output of inverter 80 is connected to a first input of an AND gate 81, and the output of AND gate 76 is also connected to a second input of AND gate 81. An output of AND gate 81 is connected to a second input of multiplexor 79. An output of multiplexor 79 is connected to a first input of an AND gate 83. The Q data output of flip-flop 57 is also connected to an input of an inverter 84. An output of inverter 84 is connected to a second input of AND gate 83. An output of AND gate 83 is connected to a first input of a multiplexor 85. The output of AND gate 81 is also connected to a first input of an AND gate 86. The second predetermined bit of the Counter Preload Value is also connected to an input of an inverter 87. An output of inverter 87 is connected to a second input of AND gate 86 which has an output connected to a second input of multiplexor 85. An output of multiplexor 85 is connected to a first input of an AND gate 90. The Q data output of flip-flop 55 is also connected to an input of an inverter 91. An output of inverter 91 is connected to a second input of an AND gate 90. An output of AND gate 90 is connected to a first input of a multiplexor 93. An output of AND gate 86 is connected to a first input of an AND gate 95. The first predetermined bit of the Counter Preload Value is connected to an input of an inverter 97. An output of inverter 97 is connected to a second input of an AND gate 95. An output of AND gate 95 is connected to a second input of multiplexor 93. An output of multiplexor 93 provides a Zero Detect Output signal. A control input of each of multiplexors 73, 79, 85 and 93 is connected to the Load input signal.

In operation, ripple counter portion 51 is a one-bit counter wherein the Clock Input signal is only connected to one bit, the least significant bit, bit zero. The least significant bit creates a clock signal for the next bit. Each bit of the ripple counter portion 51 divides the input clock frequency by two because each of flip-flops 55, 57, 60 and 63 counts down. No borrow or carry bit and thus no carry propagation is required within the count operation implemented by ripple counter portion 51. The transition of bit zero itself makes bit one change. A disadvantage with ripple counters however is that not all of the bits in the counter change logic values at the same time. In fact, the bits of a ripple counter are designed to change value in a sequential or ripple fashion with gate delays determining the speed of the counter. For many applications, this ripple operation is as disadvantageous as the slow carry propagation speed of synchronous counters.

However, in the present invention, even though a propagation delay exists, a change in logic value at the LSB position may start before the previous logic value has propagated through the entire counter circuit to the MSB position. The counting operation in counter 50 is completely contained within each bit position of ripple counter portion 51. Previously, the fact that all of the bits of ripple counter portion 51 do not change at the same time was generally considered to be a disadvantage. However, in the present invention, this operation feature is used as a benefit by zero detection portion 52.

Referring to FIG. 3, a state diagram is shown comparing the differences in counter states between a synchronous and an asynchronous counter when counting in binary from decimal value nine to zero. Each counter value is assumed to represent one clock cycle. The synchronous counter transitions thru synchronous states, detects a zero value when zero is reached, and reloads the binary value of nine. All bits in a synchronous counter change at the same time and a delay is associated with a borrow or carry to propagate thru all bits. In an asynchronous counter, the logic propagates a bit change beginning with the least significant bit. A change is rippled to the most significant bit position. Therefore, in transitioning between a nine and an eight, the LSB changes from a logic one to a logic zero. The change of the LSB to a logic zero at the Q output of flip-flop 55 does not cause flip-flop 57 to be clocked and does not cause a change in any higher ordered bits. However, in the change between an eight to a seven, three transitional states exist as noted by the three asterisks. The first intermediate state occurs when the LSB transitions from logic zero to logic one. This transition then causes the next most significant bit to transition from a logic zero to a logic one to reach the second intermediate state. The third intermediate state occurs when the second most significant bit transitions from a logic zero to a logic one making all of the bits a logic one. The final state occurs when the transition at the second most significant bit causes the most significant bit to transition from logic one to logic zero. At this point, the binary value of seven exists. Similarly, when transitioning from binary seven to six, the LSB transitions from a logic one to a logic zero. This transition does not cause the output of flip-flop 55 to clock flip-flop 57. Therefore, there are no transitional states. When transitioning from binary six to five, the LSB changes from a binary zero to a binary one which creates a transitional state because the next most significant bit then changes from a binary one to a binary zero. The transition to a binary zero does not create any more transitions in the more significant bit positions and the binary value of five has therefore been obtained. When changing from binary five to four, no transitional states are created. When changing from binary four to three, two transitional states exist as noted by the asterisks. When changing from binary three to two, no transitional states exist. When changing from binary two to one, one transitional state exists as noted by the asterisk. Finally, when changing from binary one to zero, only the LSB toggles from one to zero.

Although in the present invention, as with synchronous counters, a logic signal is propagated from least significant bit to most significant bit, the input can be changing again after a propagation of only two bit positions. Therefore, even if counter 50 is five-hundred bits long instead of four bits, a delay of only two bit positions is needed before the transition to the next binary state begins. In effect, a subsequent change is potentially overrunning a prior change. However, since there are never any two consecutive counter state changes in which bit changes propagate farther than the least significant bit, there is actually no possibility that a signal overrun will occur. Therefore, in asynchronous counter 50, bit changes are occurring concurrently for two or more state changes and in parallel. Nonetheless, correct circuit operation is guaranteed. Since the propagation delay of counter 50 is independent of the number of bits implemented by counter 50, the maximum clock frequency is not determined or limited by the number of bits and a very efficient counter is provided.

Referring again to FIG. 3, when counting from a predetermined binary number to zero, the most significant bit is the first bit which transitions to zero and remains at zero. The transition of bits to zero continues from MSB to LSB. The MSB transitions to zero within two clock cycles. However, a longer amount of time is required before the next most significant bit transitions to zero and remains at zero. By starting the zero detection from MSB to LSB and directing the detecting in that direction, the present invention takes advantage of the fact that a decrementing binary count sequence is occurring. Because counter portion 51 is a ripple counter, the signal propagated thru zero detection portion 52 does not have to be used in the count operation itself. Because a ripple counter is used, no need exists for a borrow or carry chain which allows zero detection portion 52 to work from the opposite direction. Zero detection portion 52 performs a logical NOR of all the bits of ripple counter portion 51 and is implemented as a sequentially connected distributed NOR gate.

Additionally, each of the transitional states generated by counter 50 has two or more logic ones as can be seen in FIG. 3. Those logic ones keep an erroneous zero detection from occurring. When transitioning from an eight to a seven, all the bits change. Therefore, a transitional value may occur in which all the bits are logic zero. A 'glitch' in the output of some outputs of synchronous counters may potentially occur if a zero output signal is asserted as a result of the false detection of a zero. However, in the present invention the zero-detect logic states for each bit are pre-calculated. The pre-calculated value is derived from the counter preload value. The pre-calculated value represents the correct state of the entire zero detection portion 52 immediately following the loading of counter portion 51 with the preload value and without having to wait for logic values to ripple thru zero detection portion 52. Before the most significant bit in counter portion 51 which has a logic one value can become a logic zero, the zero detect output has already become disabled by the existence of one or more logic one values in less significant bits of counter portion 51. This sequence results in the output of zero detection portion 52 being inhibited from asserting a true zero detect. If any other bits which are more significant bits also become a logic one, they also inhibit the zero detect output. When the most significant bit toggles from a logic one to a zero, a zero detect begins to be propagated thru portion 52 as a valid zero detect signal. However, the valid zero detect signal is inhibited by the next most significant bit which is a logic one. Therefore, the least significant bit may be toggled again before the most significant bit is settled. For a five-hundred bit counter, while the counter bit is being propagated thru the counter, the zero detection circuitry is inhibited. Even before the count value is propagated to the MSB, the LSB can be toggled again because each bit has correctly resolved its zero detect output. Correct detection of an all-zero state may then be used to load the preload value in parallel into counter 50 and to create a transition in the output signal.

Shown in FIG. 4 is another example in table form illustrating the counter states of the present invention in which the above-mentioned overriding is illustrated. This example illustrates the least significant bit changing before the most significant bit is stable. In the illustrated form, the initial load value is the hexadecimal value of "11". The arrowheads which are placed under a digit indicate a bit that is transiently incorrect and which does not match the hexadecimal value noted due to propagation delays. It can be noted from the illustrated state corresponding to the hexadecimal value of "0d" that transitional changes at different bit positions of the state value associated with more than one state change may exist. However, it can be verified from FIG. 4 that no signal overruns occur as multiple bit transitions occur within any one clock cycle. Although most of the counter states are not accurate for the corresponding hexadecimal values, the first and last counter states are accurate and are the only values which a user is typically interested in using.

By now it should be apparent that an improved counter and detection circuit which is particularly advantageous for a large number of bits has been provided. Because counter 50 functions to efficiently count from a first predetermined number to a second predetermined number, counter 50 may be used in applications where a frequency divide or multiplication function is needed in addition to a count function. Each of ripple counter portion 51 and zero detection portion 52 may be implemented with a variety of differing logic circuitry and with any of many varied electronic processes. Counter 50 divides a high-frequency clock by an arbitrarily large integer and may be extended to an arbitrarily large number of bits without sacrificing the maximum input clock frequency. The maximum input clock frequency is limited only by the rate which the logic circuitry used in the LSB can toggle and settle.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

I claim:

1. A circuit for counting from a first predetermined binary number to a second predetermined binary number, comprising:

counter means of predetermined bit length for receiving the first predetermined binary number, storing the first binary number and serially counting to the second binary number by transitioning between a plurality of intermediate count numbers, the counting being implemented by sequentially toggling bit values from a least significant bit position to a most significant bit position of the counter means; and detection means coupled to the counter means for providing an output indicating when the counter means has counted to the second binary number, said detection means also receiving the first predetermined binary number while the counter means is directly receiving the first predetermined binary number and monitoring the serial predetermined binary number and monitoring the serial counting of the counter means by detecting from a most significant bit position to a least significant bit position when bits of the intermediate count numbers assume a predetermined logic value, said detection means not allowing the output to be falsely provided as the result of transitional bit changes in the counter means.

2. The circuit of claim 1 wherein the counter means is a ripple counter.

3. The circuit of claim 1 wherein the counter means further comprise a plurality of counter logic portions for each bit position, each counter logic portion comprising:

a multiplexor having a first and a second input, a control input and an output, the first input receiving a predetermined bit of the first binary number, and the control input being coupled to a load control signal; and a flip-flop having a data input coupled to the output of the multiplexor, a clock input coupled to a data output of an immediately lower bit position, except the least significant counter logic portion which receives a clock signal at the clock input thereof, a complementary data output coupled to the second input of the multiplexor, and a data output coupled to both the clock input of an immediately higher bit position and to the detection means.

4. A circuit for counting from a first predetermined binary number to a second predetermined binary number, comprising:

counter means of predetermined bit length for receiving the first predetermined binary number, storing the first binary number and serially counting to the second binary number by transitioning between a plurality of intermediate count numbers, the counting being implemented by sequentially toggling bit values from a least significant bit position to a most significant bit position of the counter means; and detection means coupled to the counter means for providing an output indicating when the counter means has counted to the second binary number, said detection means also receiving the first predetermined binary number and monitoring the serial counting of the counter means by detecting from a most significant bit position to a least significant bit position when bits of the intermediate count numbers assume a predetermined logic value, said detection means not allowing the output to be falsely provided as the result of transitional bit changes in the counter means, the detection means further comprise a plurality of detection logic portions for each bit position, each detection logic portion comprising:

a first logic means having a first input coupled to a predetermined bit position of the counter means, a second input, the second input of the most significant bit position being coupled to a predetermined logic value, and an output;

a second logic means having a first input coupled to a predetermined bit of the first binary number, a second input coupled to a first output of an immediately higher bit position except the most significant bit position which has the second input coupled to the predetermined logic value, and an output for providing a first output of a predetermined bit position; and a multiplexor having a first input coupled to the output of the first logic means, a second input coupled to the output of the second logic means, a control input coupled to a load control signal, and an output coupled to the second input of the first logic means of an immediately lower bit position for providing a second output of a predetermined bit position, the second output of the least significant bit position providing the output of the detection means.

5. The circuit of claim 1 wherein the second binary number is zero.

6. In an electronic counter, a method for counting from a first predetermined number to a second predetermined number, comprising the steps of:

receiving and storing the first predetermined number;

serially counting to the second binary number with the electronic counter by transitioning between a plurality of intermediate count numbers, the counting being implemented by sequentially toggling bit values from a least significant bit position to a most significant bit position;

monitoring the serial counting by using a plurality of serially connected rank ordered detection logic circuits, each detection logic circuit except the lowest ranked detection logic circuit having an output connected to an input of an immediately lower ranked logic circuit;

detecting from the most significant bit position to the least significant bit position when bits of the intermediate count numbers assume a predetermined logic value; and providing an output signal from the detection logic circuit of lowest rank only when the second predetermined number is reached in the counting by preventing the output signal from being falsely generated should the electronic counter inadvertently indicate that the second number has been reached due to logic state transitions.

7. The method of claim 6 wherein the second predetermined number is zero.

8. A ripple counter with reverse-propagated zero detection comprising:

a ripple counter having a predetermined number of rank ordered bit cells for counting from a predetermined binary number to zero by serially modifying a bit value stored in each bit cell from a least significant bit cell to a most significant bit cell in response to an input clock signal;

zero detection logic having the predetermined number of rank ordered bit cells, each of which is coupled to a bit cell of equal rank of the ripple counter, for detecting from the most significant bit cell of the zero detection logic to the least significant a zero value in each bit cell of the ripple counter, said zero detection logic providing an output at an output of the lowest ranked bit cell thereof for indicating when the ripple counter contains an all-zero count value and not providing the output in response to any transitional zero count values detected between non-zero count values of the ripple counter; and means coupled to the ripple counter and the zero detection logic for loading a predetermined bit of the predetermined binary number into each bit cell of each of the ripple counter and the zero detection logic subsequent to the detection of the all-zero count value.

* * * * *